(12) United States Patent
Ahn et al.

(10) Patent No.: US 11,417,503 B2
(45) Date of Patent: Aug. 16, 2022

(54) METAL COMPONENT AND MANUFACTURING METHOD THEREOF AND PROCESS CHAMBER HAVING THE METAL COMPONENT

(71) Applicant: ABM CO., LTD., Asan (KR)

(72) Inventors: Bum Mo Ahn, Suwon (KR); Seung Ho Park, Hwaseong (KR)

(73) Assignee: ABM CO., LTD., Asan (KR)

( * ) Notice: Subject to any disclaimer, the term of this patent is extended or adjusted under 35 U.S.C. 154(b) by 659 days.

(21) Appl. No.: 15/634,125

(22) Filed: Jun. 27, 2017

(65) Prior Publication Data

US 2018/0019101 A1    Jan. 18, 2018

(30) Foreign Application Priority Data

Jul. 12, 2016  (KR) .......................... 10-2016-0088220

(51) Int. Cl.
*H01L 21/48*  (2006.01)
*H01L 21/67*  (2006.01)
(Continued)

(52) U.S. Cl.
CPC .......... *H01J 37/3244* (2013.01); *C22C 21/08* (2013.01); *C23C 16/4404* (2013.01);
(Continued)

(58) Field of Classification Search
CPC ....... C22C 21/08; C23C 14/564; C23C 16/22; C23C 16/4404; C23C 16/452;
(Continued)

(56) References Cited

U.S. PATENT DOCUMENTS 2,062,464 A * 12/1936 Lilienfeld ............ H01G 9/0032
                                                         205/104
3,493,474 A *  2/1970 Weber ..................... C25D 11/08
                                                         205/172
(Continued)

FOREIGN PATENT DOCUMENTS

CN       101268544 A     9/2008
CN       102337572 A     2/2012
(Continued)

OTHER PUBLICATIONS

Military Handbook (MIL-HDBK)-694A(MR). "Aluminum and Aluminum Alloys." US DOD. Dec. 15, 1966. (Year: 1966).*
(Continued)

*Primary Examiner* — Jeffrie R Lund
*Assistant Examiner* — Stanislav Antolin

(57) ABSTRACT

This invention relates to a metal component, a manufacturing method thereof, and a process chamber having the metal component, and particularly to a metal component useful in a display or semiconductor manufacturing process, a manufacturing method thereof, and a process chamber having the metal component, wherein among addition elements of an aluminum alloy that constitutes the metal substrate of the metal component, the addition element existing on the surface thereof is removed, and a barrier layer having no pores is formed, thereby solving problems attributable to a conventional anodized film having a porous layer and attributable to the addition element in the form of particles on the surface of the metal substrate.

3 Claims, 8 Drawing Sheets

(51) Int. Cl.
  *C23C 16/455* (2006.01)
  *H01J 37/32* (2006.01)
  *H01L 23/367* (2006.01)
  *C25D 11/16* (2006.01)
  *C25D 11/04* (2006.01)
  *C23C 16/44* (2006.01)
  *C22C 21/08* (2006.01)
  *C23C 16/50* (2006.01)
  *C25D 11/08* (2006.01)
  *C25D 11/02* (2006.01)

(52) U.S. Cl.
  CPC .............. *C23C 16/50* (2013.01); *C25D 11/04* (2013.01); *C25D 11/08* (2013.01); *C25D 11/16* (2013.01); *H01J 37/32467* (2013.01); *H01J 37/32477* (2013.01); *C25D 11/024* (2013.01); *H01J 2237/334* (2013.01); *H01J 2237/3321* (2013.01)

(58) Field of Classification Search
  CPC ... C23C 16/455; C23C 16/4581; C23C 16/50; C23C 22/56; C23C 22/66; C23C 28/00; C23C 28/02; C25D 11/02; C25D 11/024; C25D 11/04; C25D 11/08; C25D 11/16; C25D 11/24; C25D 11/246; H01J 2237/3321; H01J 2237/334; H01J 37/3244; H01J 37/32467; H01J 37/32477; H01J 37/32495; H01J 37/3255; H01J 37/32559; H01L 21/02532; H01L 21/0262; H01L 21/67306; H01M 4/0442; Y10T 137/0318
  See application file for complete search history.

(56) References Cited

U.S. PATENT DOCUMENTS

| | | | | |
|---|---|---|---|---|
| 3,505,179 A * | 4/1970 | Mader | ................ | C25D 11/14 205/213 |
| 3,799,848 A * | 3/1974 | Kolic | ................ | C25D 7/0614 205/201 |
| 3,971,710 A * | 7/1976 | Romankiw | ....... | H01L 21/31687 428/620 |
| 4,812,951 A * | 3/1989 | Melody | ................ | H01G 9/022 252/62.2 |
| 5,069,938 A * | 12/1991 | Lorimer | ................ | C23C 8/34 427/255.26 |
| 5,160,653 A * | 11/1992 | Clouse | ................ | H01G 9/022 252/62.2 |
| 5,192,610 A * | 3/1993 | Lorimer | ................ | C23C 8/34 428/336 |
| 5,220,140 A * | 6/1993 | Ball | ................ | B65D 81/3446 156/150 |
| 5,225,069 A * | 7/1993 | Haupt | ................ | C25D 11/04 205/325 |
| 5,230,788 A * | 7/1993 | Rabiet | ................ | C25D 11/12 205/328 |
| 5,273,858 A * | 12/1993 | Coppens | ................ | G03F 7/07 430/204 |
| 5,510,015 A * | 4/1996 | Martinez | ................ | C25D 11/22 205/105 |
| 5,779,871 A * | 7/1998 | Gillich | ................ | C25D 11/04 205/116 |
| 5,919,561 A * | 7/1999 | Fuchs | ................ | C25D 11/18 428/336 |
| 6,027,629 A * | 2/2000 | Hisamoto | ................ | B01J 3/006 205/50 |
| 6,066,392 A * | 5/2000 | Hisamoto | ................ | C25D 11/045 148/275 |
| 6,149,793 A * | 11/2000 | Melody | ................ | C25D 11/02 205/234 |
| 6,235,181 B1 * | 5/2001 | Kinard | ................ | C25D 11/04 205/148 |
| 6,267,861 B1 * | 7/2001 | Kinard | ................ | C25D 11/26 205/171 |
| 6,444,304 B1 * | 9/2002 | Hisamoto | ................ | C23C 28/00 428/212 |
| 6,720,575 B2 * | 4/2004 | Yamazaki | ................ | H01L 21/3226 257/49 |
| RE39,790 E * | 8/2007 | Fuchs | ................ | C25D 11/18 428/336 |
| 10,533,253 B2 * | 1/2020 | Ahn | ................ | C25D 11/06 205/50 |
| 2001/0031557 A1 * | 10/2001 | Lilleland | ............ | H01J 37/32009 438/689 |
| 2002/0017687 A1 * | 2/2002 | Yamazaki | ................ | H01L 27/12 257/347 |
| 2002/0187647 A1 * | 12/2002 | Dhindsa | ................ | H01J 37/3244 438/710 |
| 2003/0035970 A1 * | 2/2003 | Wada | ................ | C25D 11/06 428/472.2 |
| 2003/0062522 A1 * | 4/2003 | Yamazaki | ........ | H01L 29/66757 257/49 |
| 2003/0150530 A1 * | 8/2003 | Lin | ................ | C25D 11/04 148/518 |
| 2003/0205479 A1 * | 11/2003 | Lin | ................ | C22C 21/06 205/153 |
| 2004/0053020 A1 * | 3/2004 | Mashiko | ................ | C25D 11/18 428/209 |
| 2004/0151926 A1 * | 8/2004 | Wada | ................ | C25D 11/04 428/472 |
| 2004/0221959 A1 * | 11/2004 | Choi | ................ | C23C 16/4581 156/345.51 |
| 2004/0256089 A1 * | 12/2004 | Kobayashi | ............ | C23C 22/78 165/133 |
| 2005/0031856 A1 * | 2/2005 | Kuo | ................ | C25D 11/08 428/336 |
| 2005/0133160 A1 * | 6/2005 | Kennedy | ............ | H01J 37/3244 156/345.34 |
| 2006/0024517 A1 * | 2/2006 | Doan | ................ | C23C 16/0227 428/469 |
| 2006/0219568 A1 * | 10/2006 | Hotta | ................ | C25D 11/16 205/173 |
| 2007/0028943 A1 * | 2/2007 | Sawin | ................ | C23C 16/4405 134/1.1 |
| 2007/0028944 A1 * | 2/2007 | Sawin | ................ | H01J 37/32357 134/1.1 |
| 2007/0068629 A1 * | 3/2007 | Shih | ................ | H01L 21/3065 156/345.34 |
| 2008/0070056 A1 * | 3/2008 | Hatanaka | ................ | C25D 11/12 428/593 |
| 2008/0213618 A1 * | 9/2008 | Critchlow | ............ | C25D 11/12 428/613 |
| 2008/0241573 A1 * | 10/2008 | Askin | ................ | B05D 5/08 428/613 |
| 2009/0038946 A1 * | 2/2009 | Ohmi | ................ | C25D 11/06 205/95 |
| 2009/0047447 A1 * | 2/2009 | Sawin | ................ | B08B 7/0035 427/575 |
| 2009/0081411 A1 * | 3/2009 | Hatanaka | ................ | C25D 11/24 428/138 |
| 2009/0142588 A1 * | 6/2009 | Ohmi | ................ | C23C 4/02 428/336 |
| 2009/0145769 A1 * | 6/2009 | Tsuda | ................ | B82Y 10/00 205/206 |
| 2009/0194233 A1 * | 8/2009 | Tamura | ................ | C23C 16/4404 156/345.1 |
| 2010/0018617 A1 * | 1/2010 | Wada | ................ | C22C 21/00 148/688 |
| 2010/0025821 A1 * | 2/2010 | Ohmi | ................ | H01J 37/32706 257/607 |
| 2010/0032301 A1 * | 2/2010 | Hiratsuka | ............ | C25D 11/06 205/50 |
| 2010/0132546 A1 * | 6/2010 | Ma | ................ | B01D 71/022 95/56 |
| 2010/0219079 A1 * | 9/2010 | Routkevitch | ........ | B01D 53/228 205/175 |

(56) References Cited

U.S. PATENT DOCUMENTS

| | | | |
|---|---|---|---|
| 2010/0307579 A1* | 12/2010 | Sheng | H01L 31/056 136/256 |
| 2010/0330390 A1* | 12/2010 | Ohmi | C23C 28/00 428/212 |
| 2011/0220289 A1* | 9/2011 | Tanaka | C23C 16/4404 156/345.43 |
| 2012/0032226 A1* | 2/2012 | Su | H01L 33/60 257/99 |
| 2012/0040132 A1* | 2/2012 | Eto | C22C 21/00 428/131 |
| 2012/0091495 A1* | 4/2012 | Hatanaka | H01L 33/60 257/98 |
| 2012/0171419 A1* | 7/2012 | Russell | B82Y 30/00 428/141 |
| 2012/0171514 A1* | 7/2012 | Chang | C23C 14/025 428/627 |
| 2012/0219820 A1* | 8/2012 | Chang | C23C 14/0042 428/610 |
| 2013/0137244 A1* | 5/2013 | Kramer | H01L 21/02664 438/478 |
| 2013/0153537 A1* | 6/2013 | Isurugi | B29C 33/424 216/102 |
| 2013/0171418 A1* | 7/2013 | Mardilovich | B81C 1/00373 428/166 |
| 2013/0307092 A1* | 11/2013 | Ohmi | H01L 29/4908 257/410 |
| 2014/0042900 A1* | 2/2014 | Hotta | H05B 33/22 313/512 |
| 2014/0144783 A1* | 5/2014 | Yoon | C23C 8/02 205/188 |
| 2014/0224297 A1* | 8/2014 | Hayashi | C22C 12/00 136/230 |
| 2014/0353028 A1* | 12/2014 | Lin | C22F 1/04 174/535 |
| 2015/0090597 A1* | 4/2015 | Tatebe | C25D 11/12 205/50 |
| 2015/0096893 A1* | 4/2015 | Jeong | G06F 1/1656 205/50 |
| 2015/0132602 A1* | 5/2015 | Sun | C25D 11/16 428/651 |
| 2015/0233320 A1* | 8/2015 | Fujiwara | B24C 1/10 123/193.6 |
| 2015/0316842 A1* | 11/2015 | Taguchi | C22F 1/047 428/329 |
| 2016/0258064 A1* | 9/2016 | Pareek | C23C 16/4404 |
| 2017/0167025 A1* | 6/2017 | Ahn | B01D 67/0065 |
| 2017/0292202 A1* | 10/2017 | Curran | C25D 11/18 |
| 2017/0334171 A1* | 11/2017 | Takada | C22C 28/00 |
| 2018/0019101 A1* | 1/2018 | Ahn | C25B 11/04 |
| 2019/0076854 A1* | 3/2019 | Ahn | B05B 1/185 |
| 2019/0144993 A1* | 5/2019 | Ahn | C25D 11/34 205/50 |

FOREIGN PATENT DOCUMENTS

| | | | | |
|---|---|---|---|---|
| JP | 5-25694 | A | 2/1993 | |
| JP | 05025694 | A * | 2/1993 | |
| JP | 10-237692 | A | 9/1998 | |
| JP | 10237692 | A * | 9/1998 | H01J 37/32862 |
| JP | 2006249577 | A * | 9/2006 | |
| JP | 2006249577 | A | 9/2006 | |
| JP | 2009503905 | A * | 1/2009 | H01J 37/32862 |
| JP | 2009503905 | A | 1/2009 | |
| KR | 10-2005-0022100 | A | 3/2005 | |
| KR | 10-6482862 | B1 | 4/2005 | |
| KR | 10-2008-0000112 | A | 1/2008 | |
| KR | 10-2011-0130750 | A | 12/2011 | |
| WO | WO-2007027350 | A2 * | 3/2007 | H01J 37/32862 |
| WO | WO-2016076344 | A1 * | 5/2016 | C22C 21/02 |

OTHER PUBLICATIONS

Matweb, LLC. (1996-2020) at http://www.matweb.com/. "Overview of materials for 5000 Series Aluminum Alloy." Retrieved from http://www.matweb.com/search/datasheet.aspx?MatGUID=c71186d128cd423d9c6d51106c015e8f (Year: 1996).*

Matweb, LLC. (1996-2020) at http://www.matweb.com/. "Overview of materials for 6000 Series Aluminum Alloy." Retrieved from http://www.matweb.com/search/datasheet.aspx?MatGUID=26d19f2d20654a489aefc0d9c247cebf (Year: 1996).*

The Aluminum Association, Inc. "International Alloy Designations and Chemical Composition Limits for Wrought Aluminum and Wrought Aluminum Alloys." Jan. 2015. (Year: 2015).*

Luis Moreno Hagelsieb. "Anodic Aluminum Oxide Processing, Characterization and application to DNA Hybridization Electrical Detection." PhD Thesis. Universite catholique de Louvain. (2007). http://hdl.handle.net/2078.1/5024. (Year: 2007).*

Gerrard Eddy Jai Poinern, et al. "Review: Progress in Nano-Engineered Anodic Aluminum Oxide Membrane Development." Materials. 4 (2011). pp. 487-526. doi:10.3390/ma4030487. (Year: 2011).*

Ana Teresa Ramalho Cordeiro. "Development of Capacitive Electrodes." MS Biomedical Engineering. Instituto Superior Tecnico, Universidade de Lisboa. (Sep. 2014). https://fenix.tecnico.ulisboa.pt/cursos/mebiom/dissertacao/846778572210184. (Year: 2014).*

John W. Diggle et al. "Anodic Oxide Films on Aluminum." Chemical Reviews. 69 [3] 1969. pp. 365-405. (Year: 1969).*

Sakae Tajima. "Chapter 4: Anodic Oxidation of Aluminum." in Mars G. Fontana et al. "Advances in Corrosion Science and Technology." vol. 1, 1970. Plenum Press, pp. 229-262. (Year: 1970).*

Ryushin Omasa et al. "Temperature of Aluminum Being Anodized." Proceedings of American Electroplaters and Surface Finishers Society Annual Conference and Trade Show 2002. AESF Proc. SUR/FIN 2002. pp. 199-211. (Year: 2002).*

Julie A. Henkener. "Process Specification for the Anodizing of Aluminum Alloys." NASA/JSC PRC-5006 Rev. C (incorporating MIL-A-8625F2003). 2003. pp. 1-51. (Year: 2003).*

Satoru Inoue et al. "New Roots to Formation of Nanostructures on Glass Surface Through Anodic Oxidation of Sputtered Aluminum." Science and Technology of Advanced Materials. 4 (2003). pp. 269-276. (Year: 2003).*

Junya Kitamura et al. "Plasma-Erosion Properties of Ceramic Coating Prepared by Plasma Spraying." Materials Transactions, Japan Thermal Spraying Society. 47 [7] 2006. pp. 1677-1683. (Year: 2006).*

Tadahiro Ohmi et al. "Science Based New Silicon Technologies Based on New Manufacturing Equipment Completely Free from Contaminations and Damages." WPI-AIMR News. 8 (2009). pp. 93-107. (Year: 2009).*

Tatsuo Sato. "Innovative Development of Aluminium Research and Technologies in Japan." Proceedings of the 12th International Conference on Aluminium Alloys, Sep. 5-9, 2010, Yokohama, Japan. PL01 (2010). pp. 1-9. (Year: 2010).*

Jude M. Runge et al. "Understanding Aluminum Anodic Oxide Film Formation: Improving Engineering Properties Through Microstructural Modification." XII Ebrats Brasilian Surface Treatment Meeting and II Latin-American Interfinish. Sao Paulo. 2006. pp. 1-10. (Year: 2006).*

Yasuhiro Kawase et al. "Development of Barrier Anodic Oxide Al2O3 Passivations of Aluminum Alloy Surface for LSI/FPO Plasma Process Equipment." Journal of The Electrochemical Society. 154 [9] 2007. pp. 0530-0539. (Year: 2007).*

* cited by examiner

METAL COMPONENT AND MANUFACTURING METHOD THEREOF AND PROCESS CHAMBER HAVING THE METAL COMPONENT

BACKGROUND OF THE DISCLOSURE

1. Technical Field

The present invention relates to a metal component, a manufacturing method thereof, and a process chamber having the metal component. More particularly, the present invention relates to a metal component, which communicates with the inside of a process chamber used in a display or semiconductor manufacturing process, a manufacturing method thereof, and a process chamber having the metal component.

2. Description of the Related Art

A CVD (Chemical Vapor Deposition) device, a PVD (Physical Vapor Deposition) device, a dry etching device or the like (hereinafter, referred to as a "process chamber") uses a reactive gas, an etching gas, or a cleaning gas (hereinafter, referred to as a "process gas") in the process chamber. Since such a process gas mainly includes a corrosive gas such as Cl, F or Br, the process chamber is required to have corrosion resistance. A metal component for use in the process chamber is conventionally composed of stainless steel, but suffers from insufficient thermal conductivity and is problematic because a heavy metal such as Cr or Ni, which is an alloy element used in stainless steel, is released during the process and may thus become a contaminant. Accordingly, a component for a process chamber using pure aluminum or an aluminum alloy, which is lightweight and has high thermal conductivity and no concern about heavy metal contamination, unlike stainless steel, has been developed.

However, because of the poor corrosion resistance of the surface of the pure aluminum or aluminum alloy, surface treatment methods thereof have been studied. A method of forming an anodized film by anodizing a pure aluminum metal substrate or an aluminum alloy metal substrate may take advantage of the formation of an anodized film on a pure aluminum metal substrate and the formation of an anodized film on an aluminum alloy metal substrate. Here, the aluminum alloy, rather than pure aluminum, is useful in practice in terms of processing costs.

As illustrated in FIGS. 1 and 2A and 2B, the method of forming the anodized film on the aluminum alloy metal substrate typically includes forming an anodized film configured such that an anodized porous layer 12 is continuously formed on an anodized barrier layer by anodizing an aluminum alloy metal substrate 1. In conventional techniques, the surface-porous anodized film comprising the anodized porous layer 12 having a plurality of pores 12a is thickly formed on the aluminum alloy metal substrate, thus improving the corrosion resistance and voltage resistance of the aluminum alloy metal substrate 1. Here, the conventional surface-porous anodized film is configured such that the thickness of the barrier layer 13 is 100 nm or less, and the anodized porous layer 12 is formed to a thickness ranging from tens of μm to hundreds of μm in order to enhance voltage resistance. Most of the thickness of the conventional surface-porous anodized film is composed of the anodized porous layer 12, and thus the anodized film may crack or may be stripped due to changes in internal stress or the effect of thermal expansion. Furthermore, plasma arcing, in which plasma is focused near the exposed aluminum alloy metal substrate 1, may occur, and the surface of the aluminum alloy metal substrate 1 may be partially melted or may have defects formed thereon, which is undesirable. Also, foreign matter deposited into the pores 12a of the porous layer 12 of the anodized film is subjected to outgassing, whereby particles may be formed on a substrate, or fluorides (fluorine-based materials) used during the processing may be left behind in the pores 12a and then falls onto the surface of a substrate during subsequent processing, thus forming particles on the substrate, undesirably resulting in poor processability, lowered production yield, and reduced process chamber maintenance interval.

With the goal of solving the conventional problems with the surface-porous anodized film, undisclosed attempts have been made by the present applicant to form an anodized film composed exclusively of an anodized barrier layer on the surface of an aluminum alloy metal substrate, wherein the anodized film is grown to a thickness ranging from 100 nm to less than 1 μm. When the anodized barrier layer is formed to a thickness ranging from 100 nm to less than 1 μm on the surface of the aluminum alloy metal substrate, it can be found that the porous layer 12 is not present on the surface thereof to thus overcome the above conventional problems attributable to the presence of the porous layer 12.

However, not for a metal component where, upon the formation of the anodized film composed exclusively of the anodized barrier layer on the surface of the pure aluminum metal substrate, the anodized film is grown to a thickness ranging from 100 nm to less than 1 μm, but for a metal component where, upon the formation of the anodized film composed exclusively of the anodized barrier layer on the surface of the aluminum alloy metal substrate, the anodized film is grown to a thickness ranging from 100 nm to less than 1 μm, silicon (Si) may appear as an impurity during a CVD process to thus cause defects, which is regarded as a new problem. For example, based on undisclosed test results, as shown in FIGS. 3 to 5 (a metal coating layer 17 is illustrated in FIG. 5, but is temporarily formed for surface analysis (SEM) of the metal substrate 2 and the anodized barrier layer and is not formed through anodizing treatment of the metal substrate 2), the aluminum alloy metal substrate 2 containing silicon (Si) as an addition element is anodized so that the anodized barrier layer is grown to a predetermined thickness (100 nm to 1 μm) on the surface of the metal substrate 2, from which the peripheral portion including the silicon 15 may not be efficiently anodized due to the presence of silicon (Si) in the form of particles on the surface of the metal substrate 2 (FIG. 5). During the process using the metal component (e.g. a CVD process), such an element may act as an impurity, or arcing problems may occur therefrom.

Hence, there is a need to solve the new problem, which is not observed in the metal component configured such that the surface-porous anodized film is formed on the surface of the aluminum alloy metal substrate or in the metal component configured such that the anodized film composed exclusively of the anodized barrier layer is formed on the surface of the pure aluminum metal substrate, but is observed for the first time in the metal component configured such that the anodized film composed exclusively of the anodized barrier layer is formed on the surface of the aluminum alloy metal substrate.

Moreover, a semiconductor manufacturing process is performed these days in a 10 nm-level fine manner, and thus the process gas is heated to a high temperature and thereby converted into high-density plasma. Based on the undisclosed results of tests conducted by the present applicant, the high-density plasma may affect not only internal components of the process chamber but also components communicating with the inside of the process chamber, whereby impurities of the above components may be introduced into the process chamber and may thus be regarded as problematic during the semiconductor manufacturing process.

CITATION LIST

Patent Literature (Patent Document 1) Korean Patent No. 10-0482862
(Patent Document 2) Korean Patent Application Publication No. 10-2011-0130750
(Patent Document 3) Korean Patent Application Publication No. 10-2008-0000112

SUMMARY OF THE INVENTION

Accordingly, the present invention has been made keeping in mind the problems encountered in the related art, and the present invention is intended to provide a metal component communicating with the inside of a process chamber for use in a display or semiconductor manufacturing process, which has high corrosion resistance, voltage resistance and plasma resistance and is able to solve problems due to the presence of pores in the porous layer of a conventional surface-porous anodized film or due to the presence of the addition element of the metal substrate, a method of manufacturing the metal component, and a process chamber having the metal component.

An aspect of the present invention provides a metal component, communicating with the inside of a process chamber into which a process gas is supplied, the metal component comprising: a metal substrate composed of a metal alloy containing addition elements, at least one of the addition elements being removed from the surface of the metal substrate; and an anodized barrier layer formed on the surface of the metal substrate.

The process chamber may be a CVD process chamber, and the metal component may be a supply line for supplying a process gas into the CVD process chamber or an exhaust line for exhausting the process gas supplied into the CVD process chamber.

The process chamber may be a dry-etching process chamber, and the metal component may be a supply line for supplying a process gas into the dry-etching process chamber or an exhaust line for exhausting the process gas supplied into the dry-etching process chamber.

The metal alloy may be an aluminum alloy, and the anodized barrier layer may comprise anodized aluminum ($Al_2O_3$) formed by anodizing the aluminum alloy.

The aluminum alloy may be a 6000 series aluminum alloy, and the addition element removed from the surface of the metal substrate may include silicon (Si).

The aluminum alloy may be a 5000 series aluminum alloy, and the addition element removed from the surface of the metal substrate may include magnesium (Mg).

The surface of the metal substrate may comprise a plane region, which is substantially planar, and a plurality of concave regions, which are irregularly recessed, and the anodized barrier layer may be continuously formed to a predetermined thickness on the concave regions and the plane region.

The anodized barrier layer may have a thickness ranging from 100 nm to less than 1 μm.

Another aspect of the present invention provides a metal component, communicating with the inside of a process chamber into which a process gas is supplied, the metal component comprising: a metal substrate composed of an Al—Mg—Si-based aluminum alloy; and a surface-nonporous anodized film formed on the surface of the metal substrate, wherein silicon (Si) is removed from the surface of the metal substrate and is not present thereon, and the surface-nonporous anodized film is formed on concave regions of the surface of the metal substrate, the thickness of the surface-nonporous anodized film ranging from 100 nm to less than 1 μm.

Still another aspect of the present invention provides a metal component, communicating with the inside of a process chamber into which a process gas is supplied, the metal component comprising: a metal substrate composed of an Al—Mg—Si-based aluminum alloy; and a surface-nonporous anodized film formed on the surface of the metal substrate, wherein silicon (Si) is not detected on the surface of the metal component when measured using an energy dispersive spectrometer (EDS).

Yet another aspect of the present invention provides a metal component, communicating with the inside of a process chamber into which a process gas is supplied, the metal component comprising: a metal substrate composed of an aluminum alloy containing, as addition elements, 0.40 to 0.8% of silicon (Si), 0.7% of iron (Fe), 0.15 to 0.40% of copper (Cu), 0.15% of manganese (Mn), 0.8 to 1.2% of magnesium (Mg), 0.25% of zinc (Zn), 0.04 to 0.35% of chromium (Cr), and 0.15% of titanium (Ti); and a surface-nonporous anodized film formed on the surface of the metal substrate by anodizing the metal substrate, the surface of which has no silicon (Si) among the addition elements.

The surface-nonporous anodized film may have a thickness ranging from 100 nm to less than 1 μm.

Still yet another aspect of the present invention provides a metal component, communicating with the inside of a process chamber into which a process gas is supplied, the metal component comprising: a metal substrate composed of an aluminum alloy containing either or both of silicon (Si) and magnesium (Mg) as main addition elements, at least one of the main addition components being removed from the surface thereof; and a surface-nonporous anodized film formed in the surface shape of the metal substrate.

A further aspect of the present invention provides a metal component, communicating with the inside of a process chamber into which a process gas is supplied, the metal component comprising: a metal substrate composed of an annealed aluminum alloy containing silicon (Si) and magnesium (Mg) as main addition elements; and a surface-nonporous anodized film formed on the surface of the metal substrate having no silicon (Si) among the addition elements.

Still a further aspect of the present invention provides a metal component, communicating with the inside of a process chamber into which a process gas is supplied, the metal component comprising: a metal substrate composed of an aluminum alloy containing 0.2 to 0.9% of silicon (Si) as an addition element; and a surface-nonporous anodized film formed on the surface of the metal substrate, wherein silicon (Si) is not detected on the surface of the metal component when measured using an energy dispersive spectrometer (EDS).

Yet a further aspect of the present invention provides a method of manufacturing a metal component communicating with the inside of a process chamber into which a process gas is supplied, the method comprising: removing at least one addition element that constitutes a metal substrate from the surface of the metal substrate composed of a metal alloy; and forming an anodized barrier layer on the surface of the metal substrate by anodizing the metal substrate from which the addition element has been removed.

Still yet a further aspect of the present invention provides a process chamber configured such that a metal component communicates with the inside of the process chamber into which a process gas is supplied, the metal component comprising: a metal substrate composed of a metal alloy containing addition elements, at least one of the addition elements being removed from the surface thereof; and a surface-nonporous anodized film formed on the surface of the metal substrate by anodizing the metal substrate.

The process chamber may be a CVD process chamber, and the metal component may be a supply line for supplying a process gas into the CVD process chamber or an exhaust line for exhausting the process gas supplied into the CVD process chamber.

The process chamber may be a dry-etching process chamber, and the metal component may be a supply line for supplying a process gas into the dry-etching process chamber or an exhaust line for exhausting the process gas supplied into the dry-etching process chamber.

According to the present invention, a metal component can exhibit high corrosion resistance, voltage resistance and plasma resistance and does not cause problems attributable to the porous layer of a conventional surface-porous anodized film or attributable to the addition element present on the surface of a metal substrate.

Also, the metal component can prevent impurities from being introduced into the process chamber using high-density plasma, thus increasing the reliability and processing efficiency of the process chamber.

DESCRIPTION OF SPECIFIC EMBODIMENTS

Figure 1:
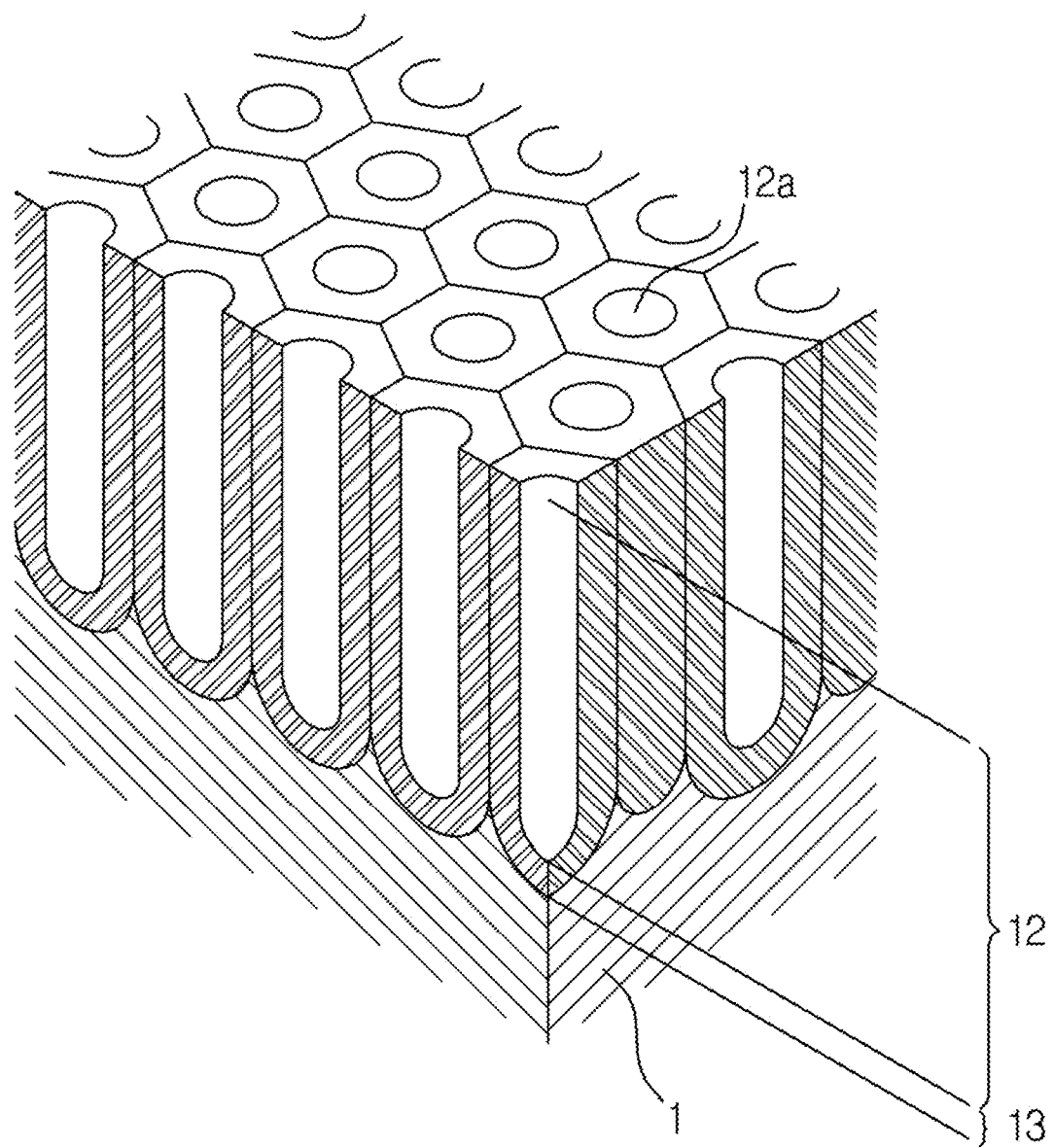
FIG. 1 shows a conventional metal component including a surface-porous anodized film.
Figure 2A:
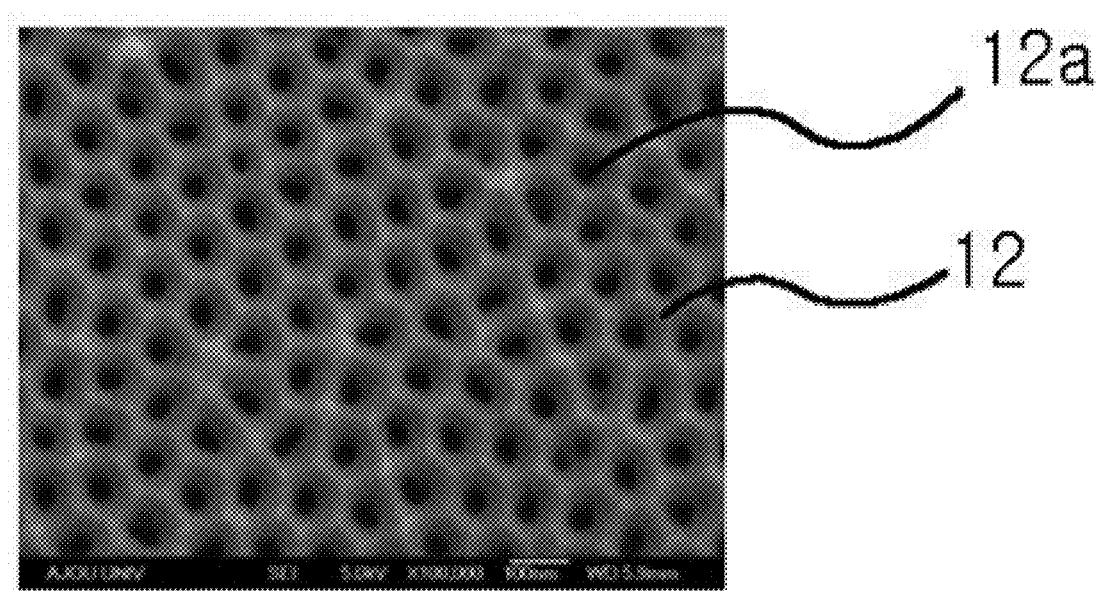
FIG. 2A is an enlarged image showing the surface of the conventional metal component including a surface-porous anodized film.
Figure 2B:
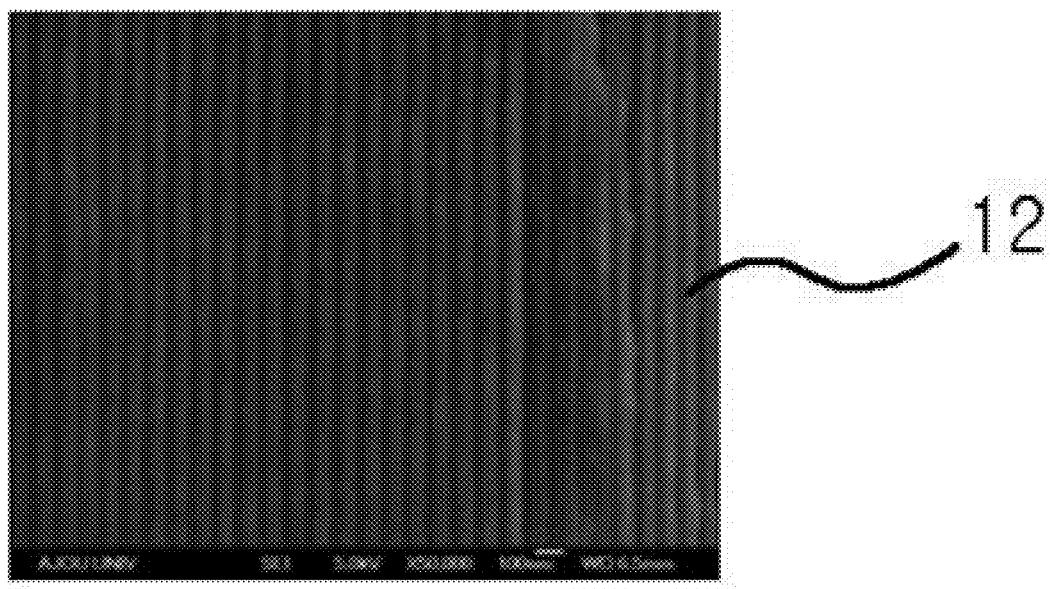
FIG. 2B is an enlarged image showing the cross-section of the conventional metal component including a surface-porous anodized film.
Figure 3:
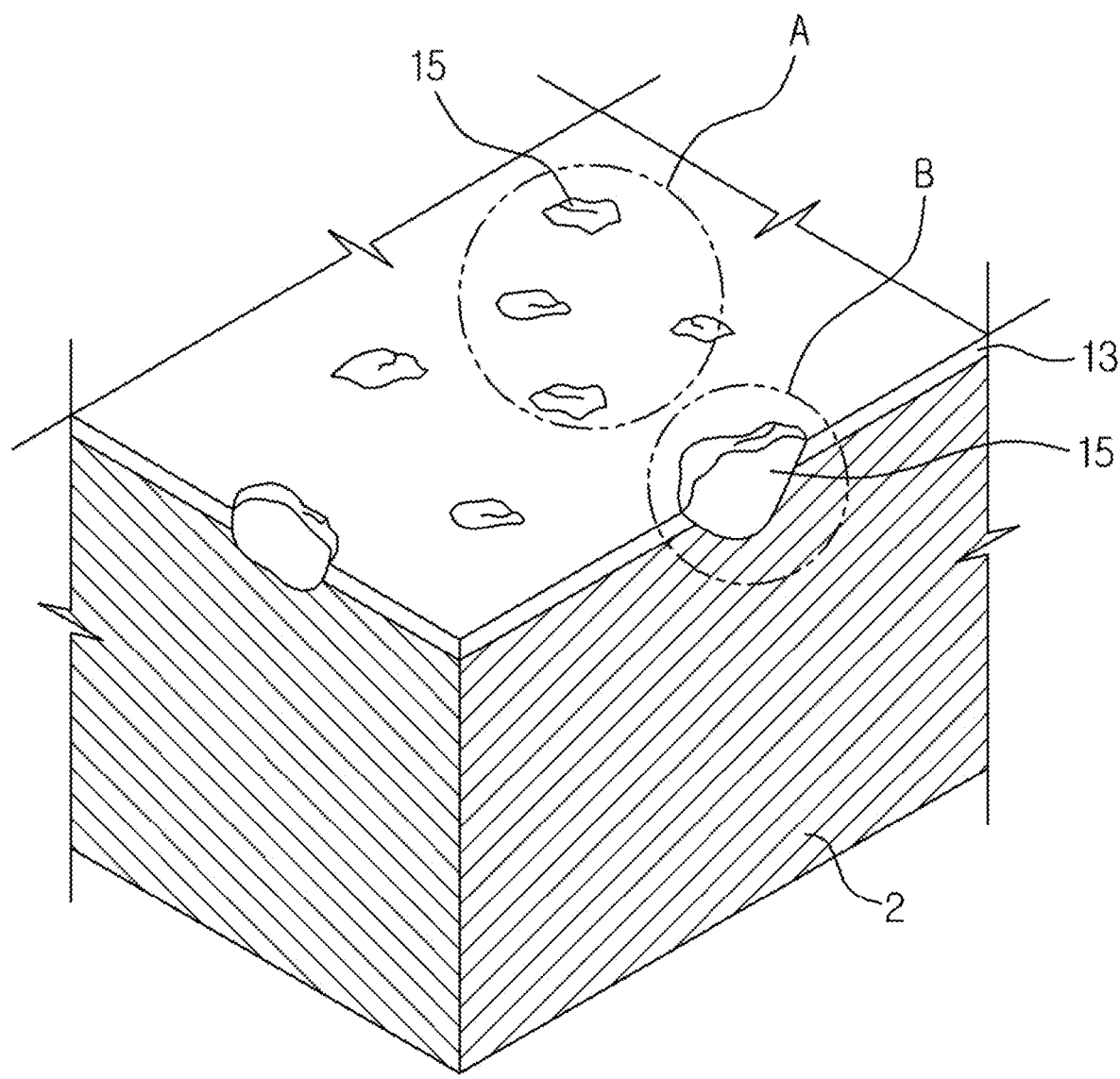
FIG. 3 shows a metal component including an anodized film composed exclusively of an anodized barrier layer in the background of the present invention.
Figure 4:
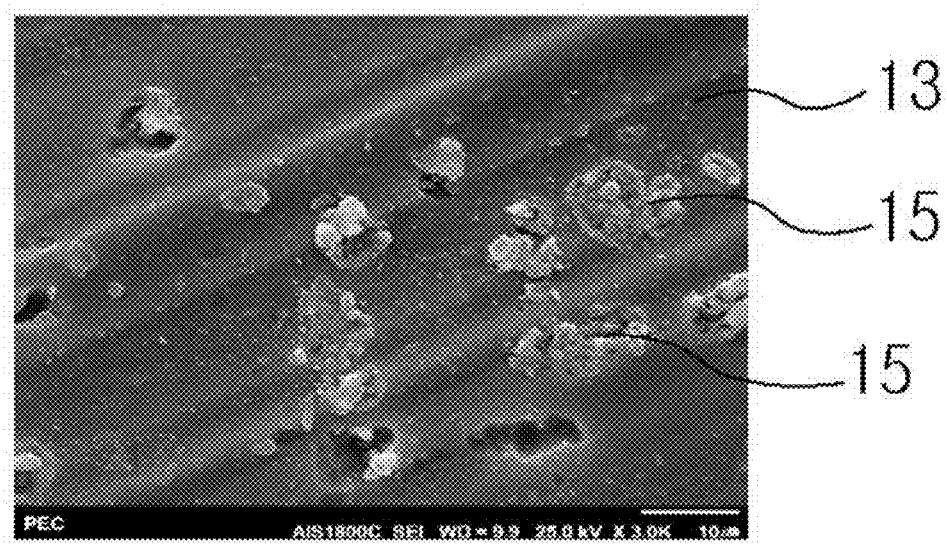
FIG. 4 is an enlarged image showing the surface A of the metal component including the anodized film composed exclusively of an anodized barrier layer.
Figure 5:
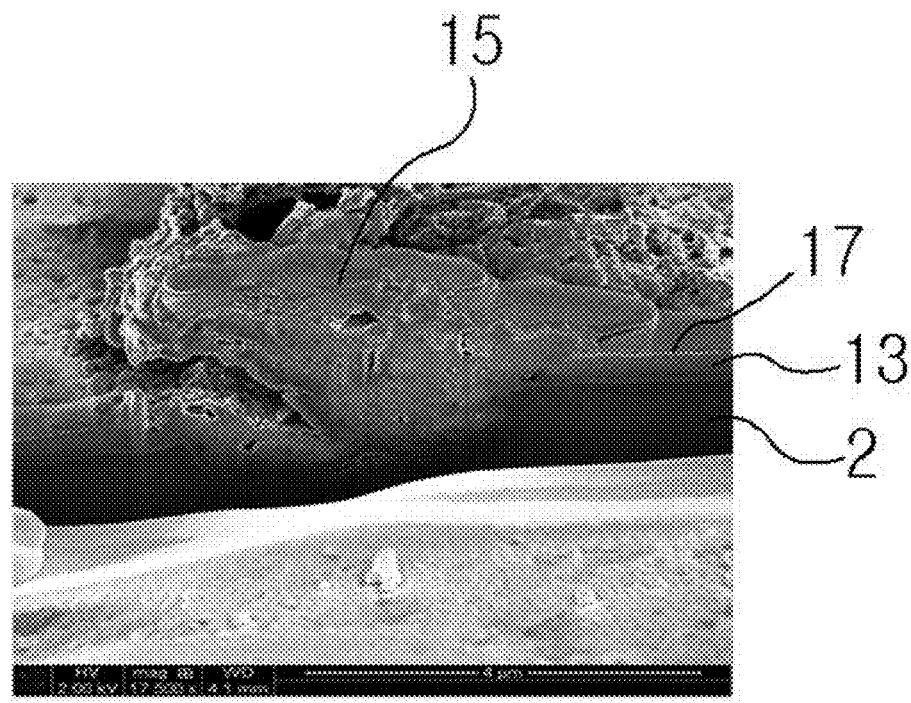
FIG. 5 is an enlarged image showing the cross-section B of the metal component including the anodized film composed exclusively of an anodized barrier layer.

Hereinafter, a detailed description will be given of preferred embodiments of the present invention with reference to the accompanying drawings. The advantages and features of the present invention and methods for achieving them will be made clear from the embodiments described in detail below, taken in conjunction with the accompanying drawings. However, the present invention is not limited to the embodiments disclosed herein, but may be modified into different forms. These embodiments are provided to thoroughly explain the invention and to sufficiently transfer the spirit of the present invention to those skilled in the art, and the present invention is defined only by the scope of the claims. Throughout the specification, the same reference numerals designate the same parts.

The embodiments of the present invention will be described with reference to cross-sectional views and/or top plan views, which are ideal exemplary views of the present invention. In the drawings, the thicknesses of films and regions are exaggeratedly depicted in order to effectively show the technical contents. Therefore, the illustrated drawings may be differently modified due to the manufacturing techniques and/or acceptable errors. The embodiments of the present invention are not limited to the specific form shown, and also include changes in the form that is produced according to the manufacturing process. Thus, the regions illustrated in the drawings have schematic attributes, and the shapes of the regions illustrated in the drawings are set forth to illustrate specific types of regions of the devices and are not to be construed as limiting the scope of the invention.

Below is a detailed description of the preferred embodiment of the present invention, made with reference to the appended drawings.

In the description of various embodiments, parts that are responsible for the same function are given the same name and the same reference numeral for the sake of description, even in different embodiments. Also, constructions and operations described in connection with preceding embodiments are omitted for the sake of brevity of description.

Figure 6:
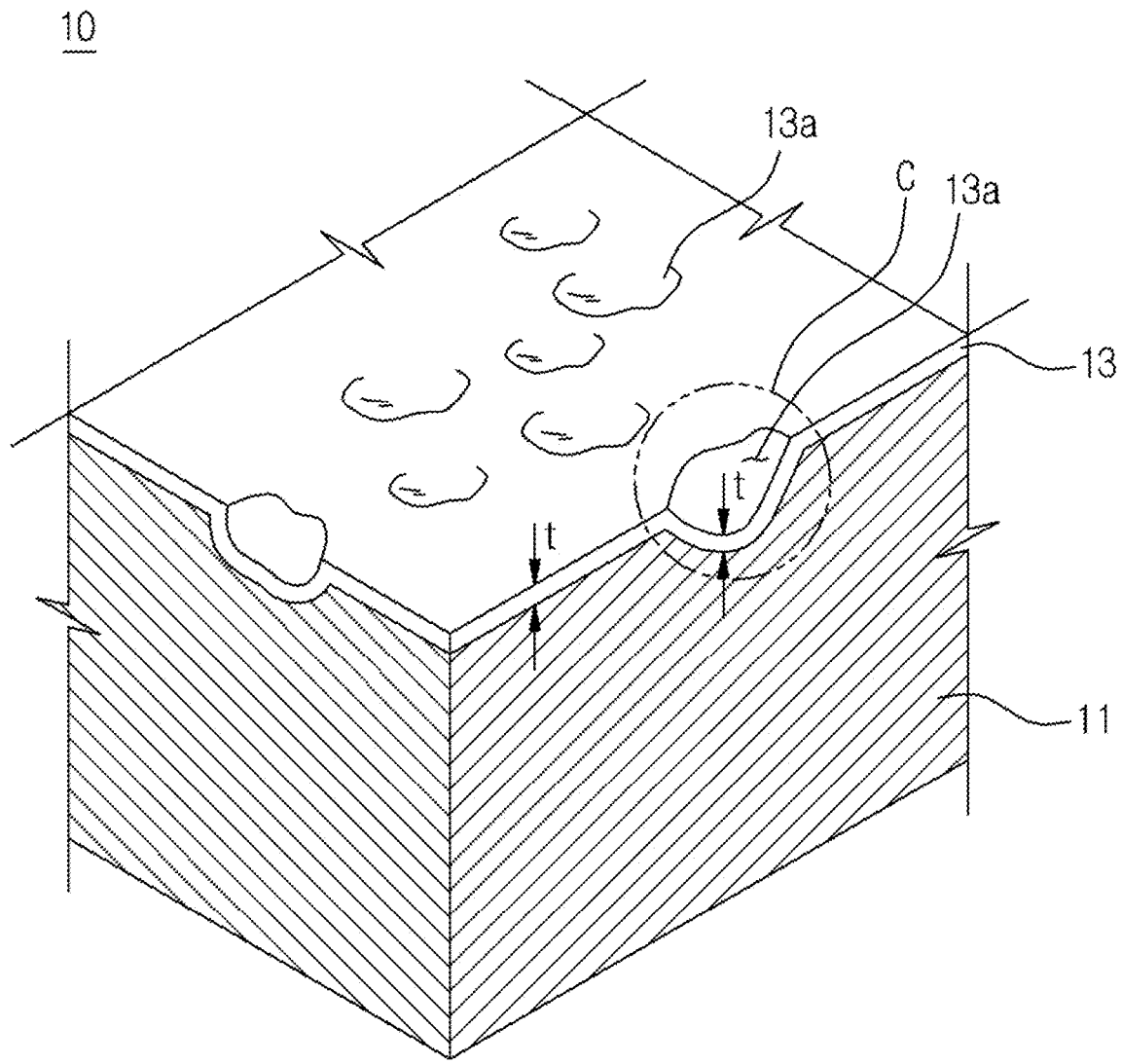
FIG. 6 shows a metal component according to a preferred embodiment of the present invention.
Figure 7:
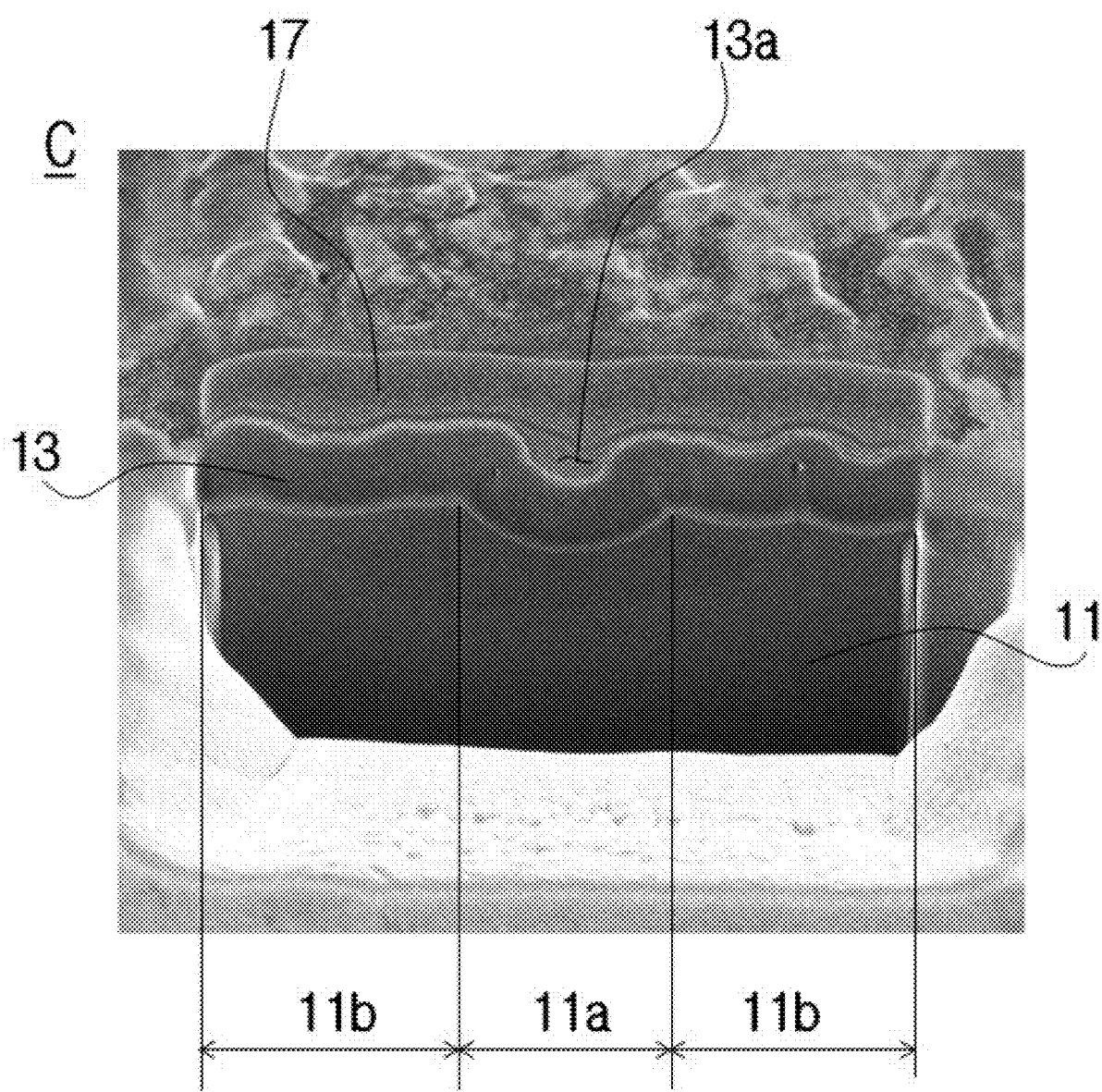
FIG. 7 is an enlarged image showing the cross-section C of the metal component according to the preferred embodiment of the present invention.
Figure 8:
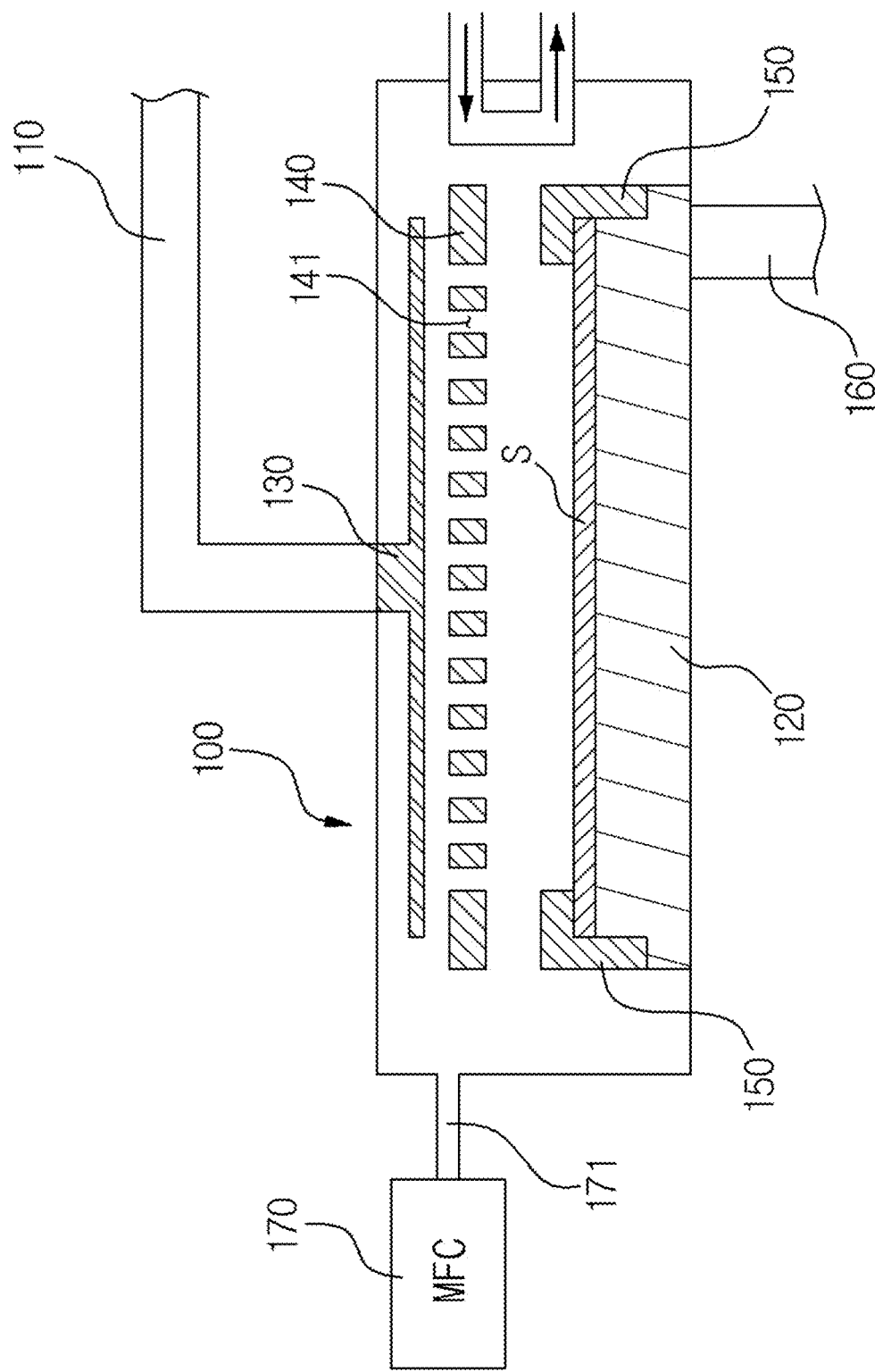
FIG. 8 shows a CVD process chamber in which the metal component according to the preferred embodiment of the present invention communicates with the inside of the process chamber into which a process gas is supplied.
Figure 9:
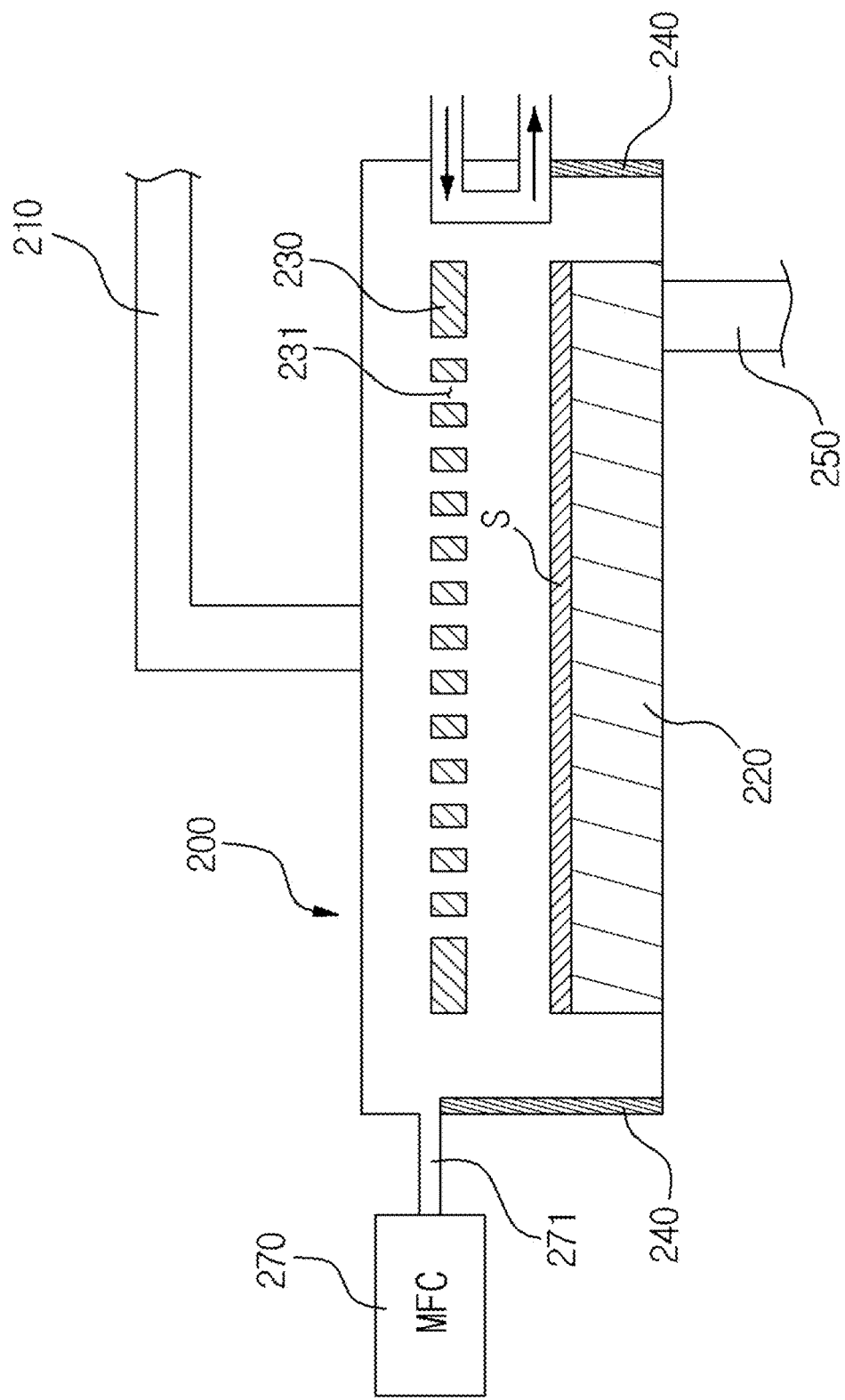
FIG. 9 shows a dry-etching process chamber in which the metal component according to the preferred embodiment of the present invention communicates with the inside of the process chamber into which a process gas is supplied.

FIG. 6 shows a metal component according to a preferred embodiment of the present invention, FIG. 7 is an enlarged image showing the cross-section C of the metal component according to the preferred embodiment of the present invention, FIG. 8 shows a CVD process chamber in which the metal component according to the preferred embodiment of the present invention communicates with the inside of the process chamber into which a process gas is supplied, and FIG. 9 shows a dry-etching process chamber in which the metal component according to the preferred embodiment of the present invention communicates with the inside of the process chamber into which a process gas is supplied. (In FIG. 7, the upper surface of the surface-nonporous anodized film 13 is coated with platinum 17 to obtain an image.)

The metal substrate 11 of the metal component 10 according to a preferred embodiment of the present invention is composed of a metal alloy containing addition elements. The metal substrate 11 according to the preferred embodiment of the present invention is preferably composed of an aluminum alloy, which is lightweight and easily processed and has high thermal conductivity, without any concern about heavy metal contamination. The aluminum alloy is prepared by adding a variety of addition elements, and the addition elements in the detailed description of the present invention may indicate various elements (Mn, Si, Mg, Cu, Zn, Cr, etc.) added upon the preparation of the metal alloy.

The surface of the metal substrate 11 is a surface obtained by removing at least one of the above addition elements.

The surface of the metal substrate 11 includes a plane region 11b, which is substantially planar, and a plurality of concave regions 11a, which are irregularly recessed in the surface of the metal substrate 11. The plane region 11b is a portion of the surface of the metal substrate 11 other than the concave regions 11a, and is substantially flat. The concave regions 11a are obtained by removing any one of irregularly existing addition elements from the surface of the metal substrate 11. Specifically, the concave regions 11a are formed by removing the addition element from regions occupied by the addition element. Thereby, the concave regions 11a have a shape recessed in the inward direction of the metal substrate 11 from the surface of the metal substrate 11.

Provided on the surface of the metal substrate 11, obtained by removing the addition element of the metal substrate 11 from the surface thereof, is a surface-nonporous anodized film (reference numeral 13 in FIG. 7 indicates platinum (Pt), but Pt is uniformly applied to a predetermined thickness on the upper surface of the surface-nonporous anodized film 13 to obtain an image, and for the sake of description, reference numeral 13 designates the surface-nonporous anodized film) . After the removal of the addition element of the metal substrate 11 from the surface thereof, the surface-nonporous anodized film 13 is formed thereon, and thus, the addition element removed from the surface of the metal substrate is not detected on the surface of the metal component according to the preferred embodiment of the present invention upon measurement using an energy dispersive spectrometer (EDS) (for example, when silicon (Si) is removed from the surface of the metal substrate 11, silicon (Si) is not detected on the surface of the metal substrate 11 upon measurement using EDS).

The surface-nonporous anodized film 13 is composed of aluminum oxide ($Al_2O_3$), and is nonporous, having no pores in the surface thereof.

The surface-nonporous anodized film 13 is continuously formed to a predetermined thickness over the entire surface of the metal substrate 11 including the concave regions 11a and the plane region 11b. Since the surface-nonporous anodized film 13 is also formed in the shape of the concave regions 11a of the metal substrate 11, the surface-nonporous anodized film 13 includes a plurality of concave portions 13a having a shape corresponding to the shape of the concave regions 11a.

The surface-nonporous anodized film 13 is continuously formed to a predetermined thickness ranging from 100 nm to less than 1 µm over the entire surface of the metal substrate 11. If the thickness of the surface-nonporous anodized film is less than 100 nm, corrosion resistance, voltage resistance and plasma resistance may become poor. On the other hand, if the thickness of the surface-nonporous anodized film 13 is 1 µm or more, the production yield is low. Hence, the thickness of the surface-nonporous anodized film preferably falls in the range of 100 nm to less than 1 µm.

According to a preferred embodiment of the present invention, the surface-nonporous anodized film 13 may exhibit high corrosion resistance and voltage resistance, and does not generate problems due to outgassing or deposition of foreign matter caused by the porous layer of the conventional surface-porous anodized film. Furthermore, the surface-nonporous anodized film 13 is formed on the surface of the metal substrate 11 having no addition element, and thus, problems due to the porous layer of the surface-porous anodized film may be solved, and moreover, by virtue of the continuous formation of the surface-nonporous anodized film 13 on the surface of the metal substrate 11 having no addition element, the addition element may be prevented from acting as an impurity due to release in the form of particles, and furthermore, plasma arcing may be prevented.

Below is a description of a method of manufacturing the surface-nonporous anodized film 13 on the surface of the metal substrate 11 of the metal component 10 according to a preferred embodiment of the present invention. The surface-nonporous anodized film 13 according to the preferred embodiment of the present invention may be an anodized barrier layer configured such that the anodized barrier layer, formed by anodizing the metal substrate 11 made of an aluminum alloy, is grown to a predetermined thickness.

During the formation of the anodized barrier layer according to a preferred embodiment of the present invention, a boric acid electrolyte is preferably used. When current is allowed to flow to the metal substrate 11 in a boric acid electrolyte bath, the anodized barrier layer is formed on the surface of the metal substrate 11. Thereafter, voltage is increased while current density is maintained constant, and the anodized barrier layer is grown to a predetermined thickness until the corresponding voltage reaches a certain voltage. When the voltage is linearly increased over time, electric field strength is maintained constant in order to realize uniform current density.

More specifically, $Al^{3+}$ ions ionized in the metal substrate 11 are introduced toward the already formed anodized barrier layer, namely in the outward direction of the metal substrate 11, and $O^{2-}$ and $OH^-$ ions ionized in the electrolyte are also introduced toward the already formed anodized barrier layer, that is, in the inward direction of the metal substrate 11, whereby the anodized barrier layer is continuously grown to a predetermined thickness. Thereby, the bound portion of the metal substrate 11 and the anodized barrier layer and the boundary portion of the anodized barrier layer and the electrolyte, namely the upper surface of the anodized barrier layer, are grown while being maintained in a state of having no pores.

The anodized barrier layer of the metal component 10 according to a preferred embodiment of the present invention is nonporous, in which a porous layer having pores is not present on the surface thereof, and the surface and inside thereof are formed without pores, and the thickness t of the anodized barrier layer is formed so as to have sufficient corrosion resistance, voltage resistance and plasma resistance for a process gas.

The thickness t of the anodized barrier layer according to a preferred embodiment of the present invention is preferably hundreds of nm, and more preferably 100 nm to less than 1 µm. The thickness of the anodized barrier layer is notably thicker than a typical thickness (100 nm or less) of the anodized barrier layer of a conventional surface-porous anodized film.

A method of manufacturing the metal component 10 according to a preferred embodiment of the present invention may include subjecting a metal substrate 11 made of an aluminum alloy to hydroxyl treatment, washing the metal substrate 11 with water, subjecting the metal substrate 11 to nitric acid treatment, subjecting the metal substrate 11 to hydrofluoric acid treatment, and forming an anodized barrier layer on the surface of the metal substrate 11 by anodizing the metal substrate 11.

Upon the hydroxyl treatment, the metal substrate 11 made of the aluminum alloy is placed in a sodium hydroxide solution so that the surface of the metal substrate 11 is etched and thereby becomes flat. When the metal substrate 11 is subjected to hydroxyl treatment in this way, the surface thereof is etched and some of the addition elements present inside the metal substrate 11 may be exposed to the surface thereof or may be stripped from the surface and then be provided in the form of being stuck to the surface. In the case where the surface-nonporous anodized film 13 is formed without removing such an addition element, the surface-nonporous anodized film 13 may be non-uniformly formed. Hence, in a preferred embodiment of the present invention, a hydrofluoric acid treatment process for removing it is adopted.

Upon the hydrofluoric acid treatment, the addition element present on the surface of the metal substrate 11 is removed. Here, any one selected from among a hydrofluoric acid solution, an ammonium fluoride solution, a mixed solution of hydrofluoric acid and nitric acid, and a mixed solution of ammonium fluoride and nitric acid may be used. Upon the hydrofluoric acid treatment, the addition element present on the surface of the metal substrate 11 is removed, whereby concave regions 11a are formed in positions occupied by the addition element.

After the hydrofluoric acid treatment, the anodized barrier layer is formed on the surface of the metal substrate 11 by anodizing the metal substrate 11. Specifically, current is allowed to flow to the metal substrate 11 in a boric acid electrolyte bath to form a nonporous anodized barrier layer on the surface of the metal substrate 11, after which voltage is increased while current density is maintained constant. Here, the anodized barrier layer is grown to a predetermined thickness until the corresponding voltage reaches a certain voltage. The anodized barrier layer is continuously formed to a predetermined thickness over the entire surface of the metal substrate including the concave regions 11a and the plane region 11b, and the description thereof remains unchanged from that given above, and is thus omitted.

The water washing process may be performed after the hydroxyl treatment and/or the hydrofluoric acid treatment, and the surface of the metal substrate 11 is washed with water, thereby removing foreign matter remaining on the surface of the metal substrate 11 and the solution used for hydroxyl treatment and/or the solution used for hydrofluoric acid treatment. The nitric acid treatment is performed in a manner in which the metal substrate 11 is placed in a nitric acid solution so that the surface of the metal substrate 11 is subjected to a kind of acid treatment, and may be conducted before the hydrofluoric acid treatment.

In a preferred embodiment of the present invention, the aluminum alloy of the metal substrate 11 of the metal component 10 may be a 6000 series aluminum alloy. With regard to the 6000 series aluminum alloy, silicon (Si), among addition elements, may become problematic, and silicon (Si) remaining in the form of particles on the surface of the metal substrate 11 is removed from the surface of the metal substrate 11, whereby the surface-nonporous anodized film may be formed to a uniform thickness on the surface of the metal substrate 11. Here, silicon (Si) removed from the surface of the metal substrate 11 may include a silicon compound, for example, magnesium silicide ($Mg_2Si$).

In a preferred embodiment of the present invention, the aluminum alloy of the metal substrate 11 of the metal component 10 may be a 5000 series aluminum alloy. With regard to the 5000 series aluminum alloy, magnesium (Mg), among addition elements, may become problematic, and magnesium (Mg) is removed from the surface of the metal substrate 11, whereby the surface-nonporous anodized film may be formed to a uniform thickness on the surface of the metal substrate 11.

In a preferred embodiment of the present invention, the aluminum alloy of the metal substrate 11 of the metal component 10 may be an aluminum (Al)-magnesium (Mg)-silicon (Si)-based aluminum alloy. With regard to the aluminum (Al)-magnesium (Mg)-silicon (Si)-based aluminum alloy, silicon (Si) remaining in the form of particles on the surface of the metal substrate 11 is removed from the surface of the metal substrate 11, whereby the surface-nonporous anodized film may be formed to a uniform thickness on the surface of the metal substrate 11.

In a preferred embodiment of the present invention, the aluminum alloy of the metal substrate 11 of the metal component 10 may be an aluminum alloy containing, as addition elements, 0.40 to 0.8% of silicon (Si), 0.7% of iron (Fe), 0.15 to 0.40% of copper (Cu), 0.15% of manganese (Mn), 0.8 to 1.2% of magnesium (Mg), 0.25% of zinc (Zn), 0.04 to 0.35% of chromium (Cr), and 0.15% of titanium (Ti). Here, silicon (Si), left behind in the form of particles on the surface of the metal substrate 11, is removed from the surface of the metal substrate 11, whereby the surface-nonporous anodized film may be formed to a uniform thickness on the surface of the metal substrate 11.

In a preferred embodiment of the present invention, the aluminum alloy of the metal substrate 11 of the metal component 10 may be an aluminum alloy containing either or both of silicon (Si) and magnesium (Mg) as main addition elements. In this case, silicon (Si) and/or magnesium (Mg) are removed from the surface of the metal substrate 11, whereby the surface-nonporous anodized film may be formed to a uniform thickness on the surface of the metal substrate 11.

In a preferred embodiment of the present invention, the aluminum alloy of the metal substrate 11 of the metal component 10 may be an annealed aluminum alloy containing, as main addition elements, silicon (Si) and magnesium (Mg). With regard to the annealed aluminum alloy containing silicon (Si) and magnesium (Mg) as main addition elements, silicon (Si) is removed from the surface of the metal substrate 11, whereby the surface-nonporous anodized film may be formed to a uniform thickness on the surface of the metal substrate 11.

In a preferred embodiment of the present invention, the aluminum alloy of the metal substrate 11 of the metal component 10 may be an aluminum alloy containing 0.2 to 0.9% of silicon (Si). With regard to the aluminum alloy containing 0.2 to 0.9% of silicon (Si), silicon (Si) is removed from the surface of the metal substrate 11, whereby the surface-nonporous anodized film may be formed to a uniform thickness on the surface of the metal substrate 11.

With reference to FIG. 8, a CVD process chamber 100, in which the metal component 10 including the surface-nonporous anodized film according to the preferred embodiment of the present invention may communicate with the inside thereof, into which a process gas is supplied, is described below.

As shown in FIG. 8, the CVD process chamber 100 is configured to include a supply line 110 for supplying a process gas to the inside of the CVD process chamber 100, a susceptor 120 installed in the CVD process chamber 100 so as to support a substrate S, a backing plate 130 disposed at the top of the CVD process chamber 100 while communicating with the supply line 110, a diffuser 140 disposed under the backing plate 130 so as to supply the process gas to the substrate S from the supply line 110, a shadow frame 150 disposed between the susceptor 120 and the diffuser 140 so as to cover the edge of the substrate S, an exhaust line 160 for exhausting the process gas from the inside of the CVD process chamber 100, and a mass flow controller (MFC) 170 for controlling the flow rate of the process gas.

Useful in the CVD process chamber 100, the substrate S may be a wafer or glass.

The CVD process chamber 100 may include the susceptor 120, the backing plate 130, the diffuser 140 and the shadow frame 150, which are installed therein, and the CVD process chamber also provides a reaction space so that chemical vapor deposition (CVD) may be carried out using the process gas.

The supply line 110 communicates with the inside of the CVD process chamber 100 from the upper side of the CVD process chamber 100, and functions to supply the process gas to the inside of the CVD process chamber 100.

The top of the CVD process chamber 100 is provided with the backing plate 130, and the backing plate 130 communicates with the supply line 110.

The exhaust line 160 communicates with the inside of the CVD process chamber 100 from the lower side of the CVD process chamber 100, and functions to exhaust the process gas to the outside of the CVD process chamber 100 from the inside of the CVD process chamber 100. Thus, the substrate S is subjected to chemical vapor deposition, after which the process gas used for the chemical vapor deposition is exhausted to the outside via the exhaust line 160.

The susceptor 120 is installed to the bottom of the space in the CVD process chamber 100, and functions to support the substrate S during the chemical vapor deposition.

The susceptor 120 may include therein a heater (not shown) for heating the substrate S depending on the processing conditions.

The backing plate 130 is disposed at the top of the CVD process chamber 100 so as to communicate with the supply line 110, and aids in uniform spraying of the process gas via the diffuser 140 by supplying the process gas to the diffuser 140 from the supply line 110.

The diffuser 140 is disposed to face the susceptor 120 under the backing plate 130, and functions to uniformly spray the process gas onto the substrate S.

Also, the diffuser 140 may include a plurality of through holes 141, which are formed through the upper and lower surfaces of the diffuser 140.

The through holes 141 may have an orifice shape in which the upper diameter is greater than the lower diameter.

Also, the through holes 141 may be formed at a uniform density over the total area of the diffuser 140, whereby the gas may be uniformly sprayed onto the entire area of the substrate S.

Specifically, the process gas is supplied into the diffuser 140 via the backing plate 130 from the gas supply line, and the process gas is uniformly sprayed onto the substrate S via the through holes 141 in the diffuser 140.

The shadow frame 150 functions to prevent a thin film from being deposited on the edge of the substrate S, and is disposed between the susceptor 120 and the diffuser 140.

In this case, the shadow frame 150 may be fixed to the lateral side of the CVD process chamber 100.

The mass flow controller 170 may be connected to the CVD process chamber 100 via a flow path 171, and functions to control the flow rate of the process gas, which is the gas flowing in the CVD process chamber 100.

In the CVD process chamber 100 thus configured, the process gas is supplied to the backing plate 130 from the supply line 110 and is then sprayed onto the substrate S via the through holes 141 in the diffuser 140, whereby the substrate S is subjected to chemical vapor deposition.

Here, the process gas may be heated and thus converted into plasma, and the plasma has strong corrosion and erosion performance. The inner surface of the CVD process chamber 100, and the susceptor 120, the backing plate 130, the diffuser 140, and the shadow frame 150 (which are referred to as "internal components"), which are installed in the CVD process chamber 100, may undergo corrosion and erosion due to plasma arcing or the like because they come into direct contact with the plasma.

Thus, at least one of the inner surface of the CVD process chamber 100, the susceptor 120, the backing plate 130, the diffuser 140, and the shadow frame 150 is preferably formed of the metal component 10 including the surface-nonporous anodized film 13, whereby problems attributable to corrosion and erosion may be solved.

Specifically, in the metal component 10 according to the preferred embodiment of the present invention, the addition element, which is regarded as problematic in the formation of the surface-nonporous anodized film 13, is removed from the surface of the metal substrate 11 before the formation of the surface-nonporous anodized film 13, thereby improving corrosion resistance, voltage resistance and plasma resistance and also overcoming problems regarding the formation of particles and outgassing due to the presence of pores. Hence, the metal component 10 is used for internal components of the CVD process chamber 100, thereby increasing the yield of finished products using the CVD process chamber 100, the processing efficiency of the CVD process chamber 100, and the maintenance interval.

When the chemical vapor deposition using the CVD process chamber 100 is a fine process for manufacturing a 10 nm-level substrate S, the process gas is heated to a high temperature and thus converted into high-density plasma. Such high-density plasma may affect not only the internal components of the CVD process chamber 100 but also the supply line 110, the exhaust line 160, the mass flow controller 170 and the flow path 171, which communicate with the inside of the CVD process chamber 100, whereby impurities may be released from the supply line 110, the exhaust line 160, the mass flow controller 170 and the flow path 171 and may then be introduced into the CVD process chamber 100, undesirably increasing the defect rate in the manufacturing process using the CVD process chamber 100.

Accordingly, at least one of the supply line 110, the exhaust line 160, the mass flow controller 170 and the flow path 171 is preferably formed of the metal component 10 including the surface-nonporous anodized film 13.

In this case, in order to prevent impurities from being released from the inner surface of the supply line 110 communicating with the inside of the CVD process chamber 100, the surface-nonporous anodized film 13 is preferably formed on the inner surface of the supply line 110. Furthermore, in order to prevent impurities from being released from the inner surface of the exhaust line 160, the mass flow controller 170 and the flow path 171, which communicate with the inside of the CVD process chamber 100, the surface-nonporous anodized film 13 is preferably formed on the inner surface of each of the exhaust line 160, the mass flow controller 170 and the flow path 171.

In this way, the components communicating with the inside of the CVD process chamber 100, particularly the supply line 110, the exhaust line 160, the mass flow controller 170 and the flow path 171, are formed of the metal component 10 including the surface-nonporous anodized film 13, thereby enhancing the plasma resistance of the inner surface of each of the supply line 110, the exhaust line 160, the mass flow controller 170 and the flow path 171 to thus prevent impurities from being released due to the high-density plasma. Even when high-density plasma is utilized for the fine process using the CVD process chamber 100, the introduction of impurities into the CVD process chamber 100 may be prevented, ultimately increasing the reliability and processing efficiency of the CVD process chamber 100.

With reference to FIG. 9, a dry-etching process chamber 200, in which the metal component 10 including the surface-nonporous anodized film 13 according to the preferred embodiment of the present invention may communicate with the inside thereof, into which a process gas is supplied, is described below.

As shown in FIG. 9, the dry-etching process chamber 200 is configured to include a supply line 210 for supplying a process gas to the inside of the dry-etching process chamber, a bottom electrode 220 provided in the dry-etching process chamber 200 so as to support a substrate S, an upper electrode 230 disposed above the bottom electrode 220 so as to supply the process gas to the substrate S from the supply line 210, a wall liner 240 installed to the inner wall of the dry-etching process chamber 200, an exhaust line 250 for exhausting the process gas from the inside of the dry-etching process chamber 200, and a mass flow controller 270 for controlling the flow rate of the process gas.

Useful in the dry-etching process chamber 200, the substrate S may be a wafer or glass.

The dry-etching process chamber 200 may include the bottom electrode 220, the upper electrode 230 and the wall liner 240, which are installed therein, and provides a reaction space so that dry etching may be carried out using the process gas.

The supply line 210 communicates with the inside of the dry-etching process chamber 200 from the upper side of the dry-etching process chamber 200, and functions to supply the process gas to the inside of the dry-etching process chamber 200.

The exhaust line 250 communicates with the inside of the dry-etching process chamber 200 from the lower side of the dry-etching process chamber 200, and functions to exhaust the process gas to the outside of the dry-etching process chamber 200 from the inside of the dry-etching process chamber 200. Thus, the substrate S is subjected to dry etching, after which the process gas used for dry etching is exhausted to the outside via the exhaust line 250.

The bottom electrode 220 is installed to the bottom of the space in the dry-etching process chamber 200, and functions to support the substrate S during the dry etching.

Also, the bottom electrode 220 may be provided with an electrostatic chuck (ESC) for minimizing the generation of static electricity from the substrate S and a baffle (not shown) for allowing the flow of the process gas around the substrate S to be maintained constant, whereby the substrate S may be subjected to uniform etching.

The upper electrode 230 is disposed to face the bottom electrode 220 that is provided at the bottom of the dry-etching process chamber 200, and functions to uniformly spray the process gas onto the substrate S.

Also, the upper electrode 230 may include a plurality of through holes 231, which are formed through the upper and lower surfaces of the upper electrode 230.

The through holes 231 may have an orifice shape in which the upper diameter is greater than the lower diameter.

Also, the through holes 231 may be formed at a uniform density over the total area of the upper electrode 230, whereby the gas may be uniformly sprayed onto the entire area of the substrate S.

Specifically, the process gas is supplied into the upper electrode 230 from the gas supply line, and the process gas is uniformly sprayed onto the substrate S via the through holes 231 in the upper electrode 230.

The wall liner 240 may be removably attached to the inner wall of the dry-etching process chamber 200, and may function to reduce the contamination of the dry-etching process chamber 200.

As the dry etching process is performed for a long period of time, when the inside of the dry-etching process chamber 200 is contaminated, the wall liner 240 may be separated and cleaned, or a new wall liner 240 may be provided, whereby the inner environment of the dry-etching process chamber 200 may be improved.

The mass flow controller 270 may be connected to the dry-etching process chamber 200 via a flow path 271, and functions to control the flow rate of the process gas, which is the gas flowing in the dry-etching process chamber 200.

In the dry-etching process chamber 200 thus configured, the process gas is supplied to the upper electrode 230 from the supply line 210 and is then sprayed onto the substrate S via the through holes 231 in the upper electrode 230, whereby the substrate S is subjected to dry etching.

In this case, the process gas may be heated and thus converted into plasma, and the plasma has strong corrosion and erosion performance. The inner surface of the dry-etching process chamber 200, and the bottom electrode 220, the electrostatic chuck of the bottom electrode 220, the baffle of the bottom electrode 220, the upper electrode 230, and the wall liner 240 (which are referred to as "internal components"), which are installed in the dry-etching process chamber 200, may undergo corrosion and erosion due to plasma arcing or the like because they come into direct contact with the plasma.

Thus, at least one of the inner surface of the dry-etching process chamber 200, the supply line 210, the bottom electrode 220, the electrostatic chuck of the bottom electrode 220, the baffle of the bottom electrode 220, the upper electrode 230, and the wall liner 240 is preferably formed of the metal component 10 including the surface-nonporous anodized film 13, whereby problems attributable to corrosion and erosion may be solved.

Specifically, in the metal component 10 according to the preferred embodiment of the present invention, the addition element, which is regarded as problematic in the formation of the surface-nonporous anodized film 13, is removed from the surface of the metal substrate 11 before the formation of the surface-nonporous anodized film 13, thereby improving corrosion resistance, voltage resistance and plasma resistance and also overcoming problems related to the formation of particles and outgassing due to the presence of pores. Hence, the metal component 10 is used for internal components of the dry-etching process chamber 200, thereby increasing the yield of finished products using the dry-etching process chamber 200, the processing efficiency of the dry-etching process chamber 200, and the maintenance interval.

When the dry etching using the dry-etching process chamber 200 is a fine process for manufacturing a 10 nm-level substrate S, the process gas is heated to a high temperature and thus converted into high-density plasma. Such high-density plasma may affect not only the internal components of the dry-etching process chamber 200 but also the supply line 210, the exhaust line 250, the mass flow controller 270 and the flow path 271, which communicate with the inside of the dry-etching process chamber 200, whereby impurities may be released from the supply line 210, the exhaust line 250, the mass flow controller 270 and the flow path 271 and may then be introduced into the dry-etching process chamber 200, undesirably increasing the defect rate in the manufacturing process using the dry-etching process chamber 200.

Accordingly, at least one of the supply line 210, the exhaust line 250, the mass flow controller 270 and the flow path 271 is preferably formed of the metal component 10 including the surface-nonporous anodized film 13.

Here, in order to prevent impurities from being released from the inner surface of the supply line 210 communicating with the inside of the dry-etching process chamber 200, the surface-nonporous anodized film 13 is preferably formed on the inner surface of the supply line 210. Furthermore, in order to prevent impurities from being released from the inner surface of the exhaust line 250, the mass flow controller 270 and the flow path 271, which communicate with the inside of the dry-etching process chamber 200, the surface-nonporous anodized film 13 is preferably formed on the inner surface of each of the exhaust line 250, the mass flow controller 270 and the flow path 271.

As described above, the components communicating with the inside of the dry-etching process chamber 200, particularly the supply line 210, the exhaust line 250, the mass flow controller 270 and the flow path 271 are formed of the metal component 10 including the surface-nonporous anodized film 13, thereby enhancing the plasma resistance of the inner surface of each of the supply line 210, the exhaust line 250, the mass flow controller 270 and the flow path 271 to thus prevent impurities from being released due to the high-density plasma. Even when high-density plasma is utilized for the fine process using the dry-etching process chamber 200, the introduction of impurities into the dry-etching process chamber 200 may be prevented, ultimately increasing the reliability and processing efficiency of the dry-etching process chamber 200.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A metal internal component provided to an inside of a process chamber into which a process gas is supplied, the metal internal component comprising:

a metal substrate composed of an aluminum alloy containing aluminum and addition elements, wherein an upper surface of the metal substrate comprises plane regions which are on a plane, and concave regions formed on the plane, the concave regions being irregularly recessed on the plane; and an anodized barrier layer comprising anodized aluminum ($Al_2O_3$) formed by anodizing the aluminum alloy, the anodized aluminum ($Al_2O_3$) being continuously formed with a predetermined thickness on the entire upper surface of the metal substrate including the plane regions and the concave regions, the predetermined thickness ranging from 100 nm to less than 1 µm, wherein the anodized barrier layer does not have a porous layer within the anodized barrier layer and pores on an upper surface of the anodized barrier layer, wherein the concave regions of the metal substrate each have a shape recessed in an inward direction of the metal substrate from the plane, wherein the concave regions of the metal substrate have the recessed shape formed by removing first addition elements among the addition elements from the metal substrate, the first addition elements having been exposed into air from the metal substrate, so that surfaces of the concave regions of the metal substrate have the aluminum without the first addition elements, wherein the anodized barrier layer includes concave portions provided on the upper surface of the anodized barrier layer, each of the concave portions of the anodized barrier layer having a shape corresponding to the recessed shape of each of the concave regions of the metal substrate, wherein a first portion of the anodized barrier layer is formed on the upper surface of the metal substrate when current is allowed to flow to the metal substrate in an acid electrolyte, and a second portion of the anodized barrier layer is grown from the first portion of the anodized barrier layer to the predetermined thickness until an increased voltage reaches a certain voltage while maintaining current density constant.

2. The metal internal component of claim 1, wherein the aluminum alloy is a 6000 series aluminum alloy, and the at least one of the addition elements removed from the upper surface of the metal substrate includes silicon (Si).

3. The metal internal component of claim 1, wherein the aluminum alloy is a 5000 series aluminum alloy, and the at least one of the addition elements removed from the upper surface of the metal substrate includes magnesium (Mg).

* * * * *